(12) United States Patent
Sochava et al.

(10) Patent No.: US 6,665,321 B1
(45) Date of Patent: Dec. 16, 2003

(54) TUNABLE LASER OPERATION WITH LOCALLY COMMENSURATE CONDITION

(75) Inventors: Sergei L. Sochava, Sunnyvale, CA (US); Andrew Daiber, Redwood City, CA (US); Mark McDonald, Milpitis, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,815

(22) Filed: Dec. 31, 2002

(51) Int. Cl.[7] .............................. H01S 3/10
(52) U.S. Cl. ................. 372/20; 372/23; 372/19; 372/98; 372/64; 372/92; 372/32; 372/29.023
(58) Field of Search .............. 372/20, 23, 19, 372/64, 98, 92, 29.023, 32

(56) References Cited

U.S. PATENT DOCUMENTS 6,526,071 B1 * 2/2003 Zorabedian et al. .......... 372/20

2002/0172239 A1 * 11/2002 McDonald et al. .......... 372/20

* cited by examiner

*Primary Examiner*—Leon Scott, Jr.
(74) *Attorney, Agent, or Firm*—Blakley, Sokoloff, Taylor & Zafman LLP

(57) ABSTRACT

A method for selecting free spectral ranges (FSR) of intra-cavity optics to optimize reliability of the channel switching mechanism and corresponding apparatus. In particular, the optimal relationship between the FSR of the internal etalon and the FSR of the laser cavity is derived. For the external cavity diode lasers (ECDL) the optimal relationship between the FSR of the internal etalon and the FSR of the gain chip is also derived. Equations are derived for selecting free spectral ranges of various optical cavities so as to create a locally commensurate condition under which the relative position of the lasing mode with respect to the transmission peak of the laser's tunable filter (e.g., etalon plus channel selector) does not change when the laser hops between adjacent channels.

29 Claims, 12 Drawing Sheets

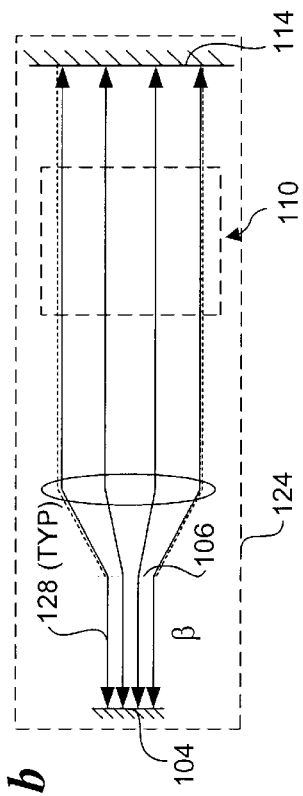
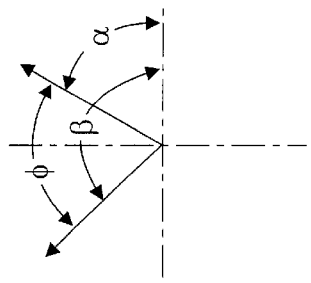
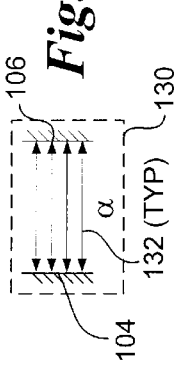
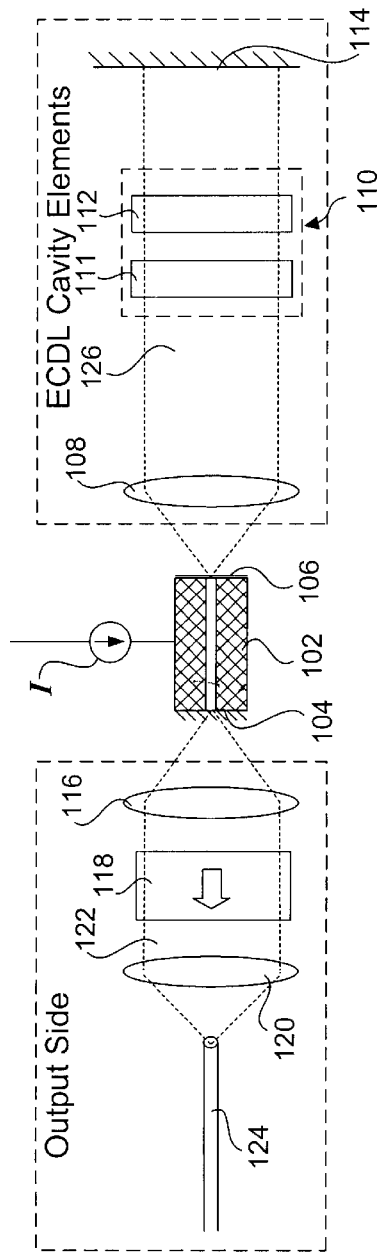
Fig. 1b
Fig. 1c
Fig. 1d
Fig. 1a

TUNABLE LASER OPERATION WITH LOCALLY COMMENSURATE CONDITION

FIELD OF THE INVENTION

The field of invention relates generally to optical communication systems and, more specifically but not exclusively relates to enhanced tunable lasers and methods for providing enhanced channel switching in such tunable lasers.

BACKGROUND INFORMATION

There is an increasing demand for tunable lasers for test and measurement uses, wavelength characterization of optical components, fiberoptic networks and other applications. In dense wavelength division multiplexing (DWDM) fiberoptic systems, multiple separate data streams propagate concurrently in a single optical fiber, with each data stream created by the modulated output of a laser at a specific channel frequency or wavelength. Presently, channel separations of approximately 0.4 nanometers in wavelength, or about 50 GHz are achievable, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity lasers have been developed to overcome the limitations of individual DFB devices. Various laser tuning mechanisms have been developed to provide external cavity wavelength selection, such as mechanically tuned gratings used in transmission and reflection. External cavity lasers must be able to provide a stable, single mode output at selectable wavelengths while effectively suppress lasing associated with external cavity modes that are within the gain bandwidth of the cavity. These goals have been difficult to achieve, and there is accordingly a need for an external cavity laser that provides stable, single mode operation at selectable wavelengths.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 1a is a schematic diagram of a generalized external cavity laser for which various embodiment of the invention may be derived in accordance with the teachings and principles disclosed herein;

FIG. 1b is a schematic diagram illustrating a laser cavity defined by a partially-reflective front facet of a Fabry-Perot gain chip and a reflective element;

FIG. 1c is a schematic diagram illustrating an optical cavity correspond to the Fabry-Perot gain chip;

FIG. 1d is a diagram illustrating a phase difference between lasing modes in the laser cavity and the gain chip cavity;

DETAILED DESCRIPTION OF PREFERRED EMBODIMENTS

Figure 2:
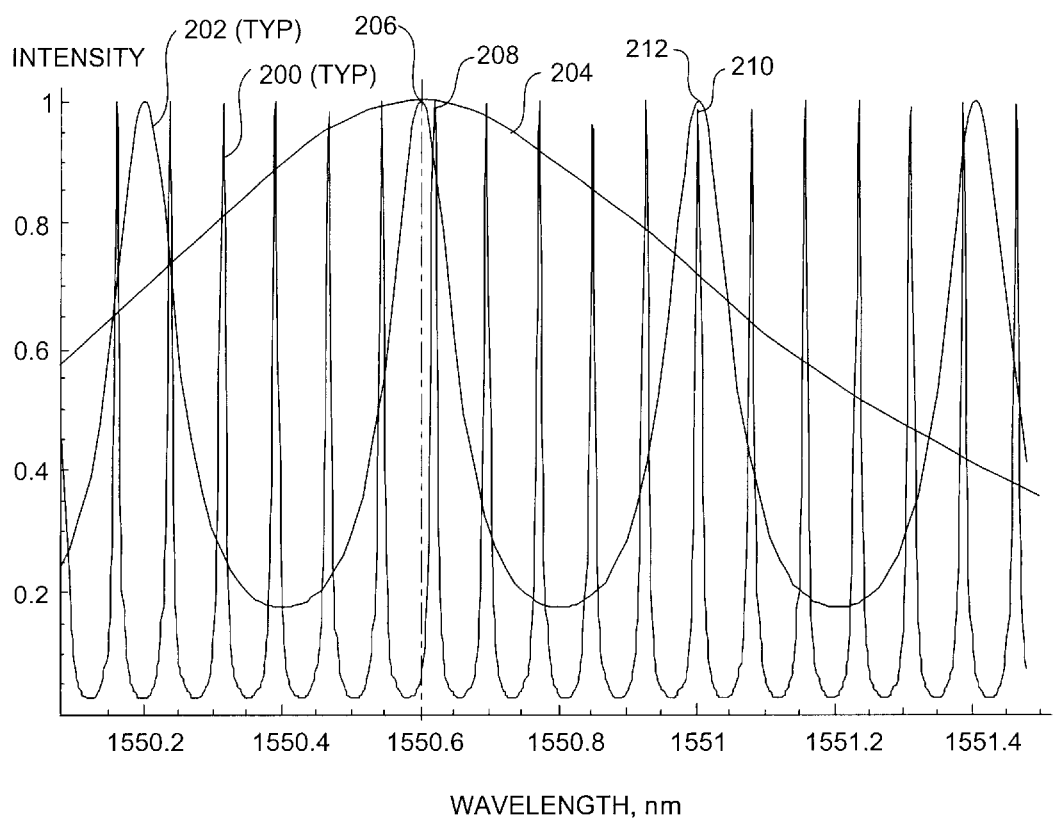
FIG. 2 is a diagram illustrating a relative position of a laser cavity's lasing modes with expect to transmission peaks defined by an intra-cavity etalon and channel selector.

Embodiments of method and laser apparatus that provided enhanced laser performance are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Discrete wavelength tunable diode lasers typically comprise a semiconductor gain medium, two reflectors, a "static" etalon (or etalons) that defines a set of discrete equally-spaced wavelengths (channels), and a channel selecting mechanism that enables the laser output to comprise a single selectable wavelength from the set of wavelengths defined by the static etalon or etalons. For example, as an overview, a generalized embodiment of an external cavity diode laser (ECDL) 100 is shown in FIG. 1. ECDL 100 includes a gain medium comprising a diode gain chip 102. Diode gain chip 102 comprises a Fabry-Perot diode laser including a partially-reflective front facet 104 and a anti-reflective rear facet 106 coated with an anti-reflective (AR) coating to minimize reflections at its face. Optionally, diode gain chip 102 may comprise a bent-waveguide structure on the gain medium to realize the non-reflective rear facet 106. The external cavity elements include a diode intracavity collimating lens 108, tuning filter element or elements 110, and a reflective element 114. In general, reflective element 114 may comprise a mirror, grating, prism, or other reflector or retroreflector which may also provide the tuning filter function in place of tuning element 110. The output side components include a diode output collimating lens 116, an optical isolator 118, and a fiber focusing lens 120, which focuses an output optical beam 122 such that it is launched into an output fiber 124.

The basic operation of ECDL 100 is a follows. A controllable current I is supplied to diode gain chip 102 (the gain medium), resulting in a voltage differential across the diode junction, which produces an emission of optical energy (photons). The emitted photons pass back and forth between partially-reflective front facet 104 and reflective element 114, which collectively define the ends of an "effective" laser cavity (i.e., the two reflectors discussed above), as depicted by laser cavity 126 in FIG. 1b. As the photons pass back and forth, a plurality of resonances, or "lasing" modes are produced. Under a lasing mode, a portion of the optical energy (photons) temporarily occupies the external laser cavity, as depicted by intracavity optical beam 126 and light rays 128; at the same time, a portion of the photons in the external laser cavity eventually passes through partially-reflective facet 104.

Light comprising the photons that exit the laser cavity through partially-reflective front facet 104 passes through diode output collimating lens 116, which collimates the light into output beam 122. The output beam then passes through optical isolator 118. The optical isolator is employed to prevent back-reflected light from being passed back into the external laser cavity, and is generally an optional element. After the light beam passes through the optical isolator, it is launched into the output fiber 124 by fiber focusing lens 120. Generally, output fiber 124 may comprise a polarization-preserving type or a single-mode type such as SMF-28.

Through appropriate modulation of the input current (generally for communication rates of up to 2.5 GHz) or through modulation of an external element disposed in the optical path of the output beam (not shown) (for 10 GHz and 40 GHz communication rates), data can be modulated on the output beam to produce an optical data signal. Such a signal may launched into a fiber and transmitted over a fiber-based network in accordance with practices well known in the optical communication arts, thereby providing very high bandwidth communication capabilities.

The lasing mode of an ECDL is a function of the total optical path length between the cavity ends (the cavity optical path length); that is, the optical path length encountered as the light passes through the various optical elements and spaces between those elements and the cavity ends defined by partially-reflective front facet 104 and reflective element 114. This includes diode gain chip 102, diode intracavity collimating lens 108, tuning filter elements 110, and cavity-length modulating element 112, plus the path lengths between the optical elements (i.e., the path length of the transmission medium occupying the ECDL cavity, which is typically a gas such as air). More precisely, the total optical path length is the sum of the path lengths through each optical element and the transmission medium times the coefficient of refraction for that element or medium.

As discussed above, under a lasing mode, photons pass back and forth between the cavity end reflectors at a resonance frequency, which is a function of the cavity optical path length. In fact, without the tuning filter elements, the laser would resonate at multiple frequencies. For simplicity, if we model the laser cavity as a Fabry-Perot cavity, these frequencies can be determined from the following equation:

$$Cl = \frac{\lambda x}{2n} \quad (1)$$

where λ=wavelength, Cl=Length of the cavity, x=an arbitrary integer—1, 2, 3, . . . , and n=refractive index of the medium. The number of resonant frequencies is determined from the width of the gain spectrum. The corresponding lasing modes for the cavity resonant frequencies are commonly referred to as "cavity modes," an example of which is depicted by cavity modes 200 in FIG. 2.

In order to produce an output at a single wavelength (or frequency), filtering mechanisms are employed to substantially attenuate all lasing modes except for the lasing mode corresponding to the desired wavelength. As discussed above, in one scheme a pair of etalons, depicted as a grid generator 111 and a channel selector 112 in FIG. 1. The grid generator, which comprises a static etalon that operates as a Fabry-Perot resonator, defines a plurality of transmission peaks (also referred to as passbands) in accordance with equation (1). Ideally, during operation that transmission peaks remained fixed, hence the term "static" etalon; in practice, it may be necessary to employ a servo loop (e.g., a temperature control loop) to maintain the transmission peaks at the desired location. Since the cavity length for the grid generator is less than the cavity length for the laser cavity, the spacing (in wavelength) between the transmission peaks is greater for the grid generator than that for the cavity modes. A set of transmission peaks 202 corresponding to an exemplary etalon grid generator is shown in FIG. 2. Note that at the peaks of the waveform the intensity (relative in the figure) is a maximum, while it is a minimum at the troughs. Generally, the location and spacing of the transmission peaks for the grid generator will correspond to a set of channel frequencies defined by the communication standard the laser is to be employed for, such as the ITU channels and 0.04 nanometer (nm) spacing discussed above and depicted in FIG. 2. Furthermore, the spacing of the transmission peaks corresponds to the free spectral range (FSR) of the grid generator.

As discussed above, a channel selector, such as an adjustable etalon, is employed to select the lasing mode of the laser output. For illustrative purposes, in one embodiment channel selector 112 may comprise an etalon having a width substantially less than the etalon employed for the grid generator. In this case, the FSR of the channel selector is also substantially less than that of the grid generator; thus the bandpass waveform of the channel selector is broadened, as illustrated by channel selector bandpass waveform 204 having a single transmission peak 206. In accordance with this channel selection technique, a desired channel can be selected by aligning the transmission peak of the channel selector (e.g. 206) with one of the transmission peaks of the grid generator. For example, in the illustrated configuration depicted in FIG. 2, the selected channel has a frequency corresponding to a laser output having a 1550.6 nm wavelength.

In addition to the foregoing scheme, several other channel selecting mechanisms may be implement, including rotating a diffraction grating; electrically adjusting a tunable liquid crystal etalon; mechanically translating a wedge-shaped etalon (thereby adjusting its effective cavity length); and "Vernier" tuning, wherein etalons of the same finesses and slightly different FSRs are employed, and a respective pair of transmission peaks from among the transmission peaks defined by the etalons are aligned to select the channel in a manner similar to that employed when using a Vernier scale.

Note that in the illustrated example of FIG. 2, the transmission peak 208 of the cavity mode nearest the selected channel is misaligned with the transmission peaks for the grid generator and channel selector. As a result, the intensity of the laser output is attenuated due to the misalignment, which is reflected in the form of cavity losses. Various mechanisms may be employed to shift the cavity mode transmission peaks such that they are aligned with the grid generator and channel selector transmission peaks, thus yielding a maximum intensity in the laser output. Generally, under such schemes the optical path length of the laser cavity is adjusted so that it equals a multiple half-wavelength ($\lambda/2$) of the transmission wavelength selected by the grid etalon and channel selector (i.e., the wavelength at which grid etalon and channel selector transmission peaks are aligned). In one embodiment known as "wavelength locking," an electronic servo loop is implemented that employs a modulated excitation signal that is used to modulate the overall cavity optical path length, thereby producing wavelength and intensity modulations in the laser output. A detection mechanism is employed to sense the intensity modulation (either via a measurement of the laser output intensity or sensing a junction voltage of the gain medium chip) and generate a corresponding feedback signal that is processed to produce a wavelength error signal. The wavelength error signal is then used to adjust the unmodulated (i.e., continuous) overall cavity optical path length so as to align the transmission peak of the cavity mode with the transmission peaks of the grid generator and channel selector.

Channel boundaries (channel selector states for which lasing mode hops to the adjacent channel) are usually determined experimentally during laser calibration procedure. In order to make channel switching reliable and repeatable, one has to provide the conditions under which channel boundaries do not move as a function of some parameters, that we do not have control of other parameters, distinct from the parameters of the channel switching elements described previously, which are not controlled for the purposes of channel switching.

One such parameter is the optical path length of the cavity. Although, as discussed above, during steady state operation the cavity optical path length is "locked" by the servo loop, during channel switching it is not locked and can take any value within a certain range (usually this range is of the order of few microns). For the random relationship between the FSR of the etalon and the FSR of the cavity some channels have advantages over the other channels because for these channels the nearest cavity mode is closer to the transmission peak and therefore has lower transmission losses. For example, notice that a transmission peak 210 corresponding to a cavity mode and a transmission peak 212 corresponding to the grid generator are substantially aligned in FIG. 2.

Figure 3:
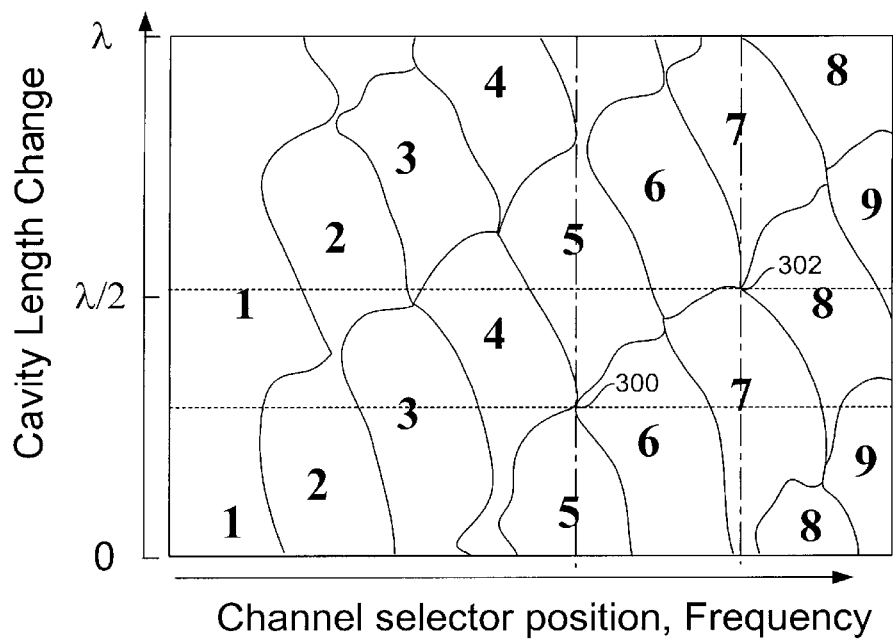
FIG. 3 is a diagram illustrating frequency as a function of channel selector position and cavity length change for an laser cavity having an non-commensurate condition.

The inconsistency between the cavity mode and grid generator (static etalon) FSRs perturbs channel boundaries and makes some channels broader than others. For example, FIG. 3 shows experimental data illustrating the relationship between laser output frequency as a function of channel selector position (horizontal) and cavity optical path length change (vertical). For this particular experiment, the cavity optical path length corresponds to the physical length of the laser cavity. The optical path length of the cavity can also be adjusted via adjustment of the optical path length for an optical element disposed in the laser cavity as well. One can see that both channel width and channel center position depend on the cavity length. At some particular cavity lengths some channels are completely squeezed out by the adjacent channels, such as depicted by cavity channel/frequency intersection points 300 and 302. Tuning such a laser would be not repeatable because one channel selector position can result in lasing on different channels depending on the exact cavity length at the moment of switching.

Another parameter that can affect channel selection process is the phase of the residual reflection from the AR-coated facet of the gain chip (for ECDLs). In a conventional monolithic diode laser, such as that which may be employed for gain medium 102, the "laser cavity" is typically defined by the cleaved facets of the diode chip, i.e., front and rear facets 104 and 106. For clarity, this will be called the "F-P laser cavity" hereinafter, an example of which is graphically depicted as an F-P laser cavity 130 in FIG. 1c. Typically, both facets of a conventional Fabry-Perot diode laser will comprise partially-reflective elements that operate as a pair of parallel mirrors placed opposite one other, causing the laser cavity to operate as a Fabry-Perot resonator, thereby enabling lasing to occur. However, when employed in an ECDL, such as ECDL 100, it is desired to minimize the light that is internally reflected from the rear facet, thus the use of the AR-coating for such purposes. The end result is that the "effective laser cavity," referred to as the "laser cavity" above, spans between front facet 104 and reflective element 114, as shown in FIG. 1b. The cavity between AR-coated rear facet 106 and reflective element 14 is termed the "external laser cavity," thus the name external cavity diode laser.

In practice, it is not possible to achieve zero reflection at the AR-coated rear facet. As a result, a small fraction of the light produced by the diode chip is reflected from AR-coated facet 106, causing the portion of light to resonate within F-P laser cavity 130, as illustrated by light rays 132. This results in multiple lasing modes having a corresponding FSR termed herein as the "gain chip FSR." At the same time, the vast majority of the light produced by diode chip is reflected between the partially reflective front facet 104 and reflective element 114, resulting in multiple lasing modes having an FSR corresponding to the overall optical path length of the (effective) cavity, in the manner discussed above. The phases of the gain medium and laser cavity lasing modes are respectively depicted as phase angles α and β in FIG. 1d.

When the facet reflectivity of AR-coated facet 106 (the laser facet reflectivity $R_{facet}$) is small (e.g., $10^{-5}$ to $10^{-3}$) relative to the reflectivity of the external laser cavity optics $R_{ext}$ (e.g., $10^{-2}$ to 1) over a particular frequency range, the facet reflectivity may be considered as a perturbation imposed upon the reflectivity verses frequency of the external cavity in that frequency range, and this perturbation is the interference between the light reflected off the facet (i.e., light rays 132) and the light reflected back from the external cavity optics (i.e., light rays 128). Alternately, a regime may be considered where the laser facet reflectivity is large relative to the reflectivity of the external cavity optics. In this case, the effective laser cavity is defined by the laser facets, and the external laser cavity is treated as a perturbation on this laser cavity. Finally, the general regime may be considered where neither the facet reflectivity nor the external cavity reflectivity is assumed to be small relative to the other. In this case, neither the cavity length defined by the laser facet nor the cavity length defined by the end mirror is treated as dominating the laser behavior. The laser behaves as if it consists of two interfering cavities and assumes characteristics of both cavities.

Figure 4:
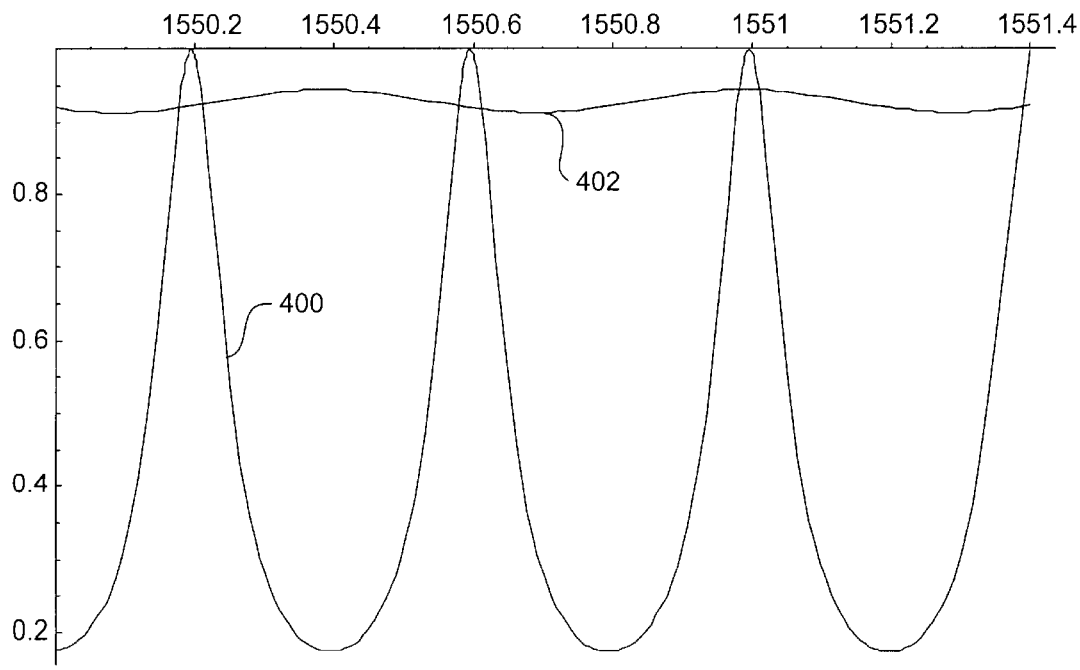
FIG. 4 is a graph illustrating a relative position of gain chip resonance peaks with respect to the etalon transmission peaks for a non-commensurate condition.

For the random relationship between the FSR of the static etalon and the FSR of the gain chip, some channels have an advantage over the other channels because for these channels the residual reflection from the gain chip facet is in phase with the external cavity reflection while for other channels they are not in phase. An example of this is graphically depicted in FIG. 4, which shows a static etalon transmission waveform 400 and a gain chip transmission waveform 402. In this example, the channel corresponding to the 1551 nm transmission wavelength has a lower loss than its neighbor channels because the residual reflection from the gain chip facet is in phase with the reflection from the external cavity.

Figure 5:
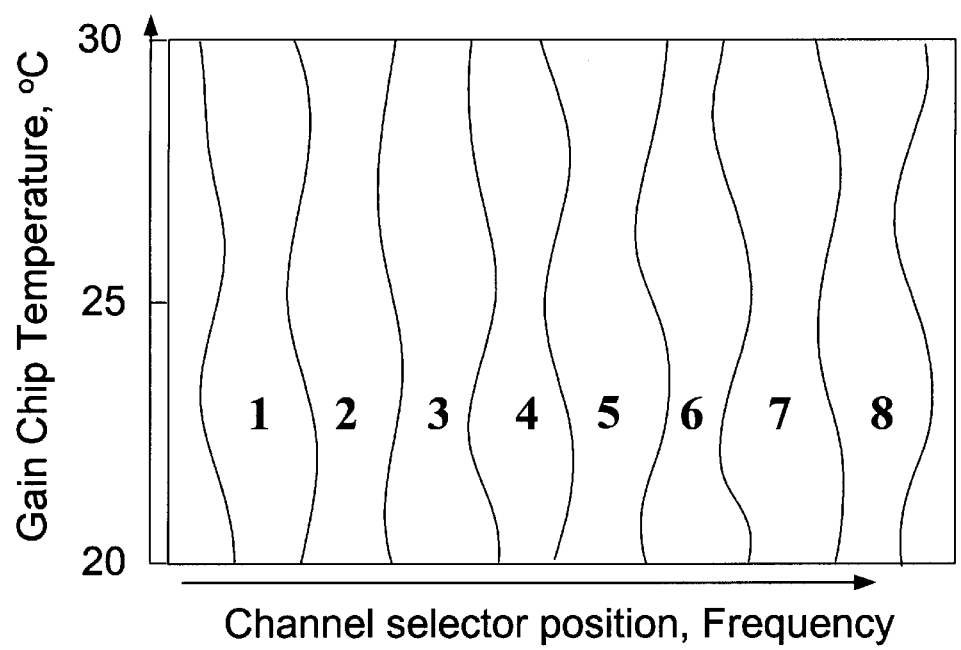
FIG. 5 is a diagram illustrating frequency as a function of channel selector position and gain chip temperature for a locked laser with residual facet reflectivity $R=9*10^{-4}$ and $FSR_{chip}/FSR_{etalon}=1.5$.

This difference in the phase angles between the gain chip and external cavity reflections (α and β) perturbs channel boundaries, making some channels broader than others. For example, FIG. 5 shows experimental data for laser frequency as a function of channel selector position (horizontal) and gain chip temperature (vertical) measured for a locked external cavity diode laser with an AR-coated rear facet residual reflectivity $R=9*10^{-4}$. The numbered regions correspond to different channels that differ in lasing frequency by approximately one FSR of the intracavity etalon from consecutively numbered channels. One can see that the channel width depends on the gain chip temperature, which controls the phase of the residual reflection from the AR-coated rear facet.

As a result of the foregoing effects, channel switching is not repeatable because of the high probability of landing on a wrong channel. In accordance with aspects of the invention, channel switching problems associated with these adverse effects are substantially eliminated by providing ECDL embodiments in which neither the channel width nor the channel position vary as a function of cavity length or gain chip temperature.

Briefly, and in general terms, embodiments of the present invention provide a method of selecting free spectral ranges (FSR) of intra-cavity optics to optimize reliability of the channel switching mechanism. In one embodiment the optimal relationship between the FSR of the static etalon and the FSR of the laser cavity is derived. This relationship provides that neither the width of the channels nor their position depend on the optical length of the cavity, preventing the laser from switching to wrong channels during tuning.

Figure 6:
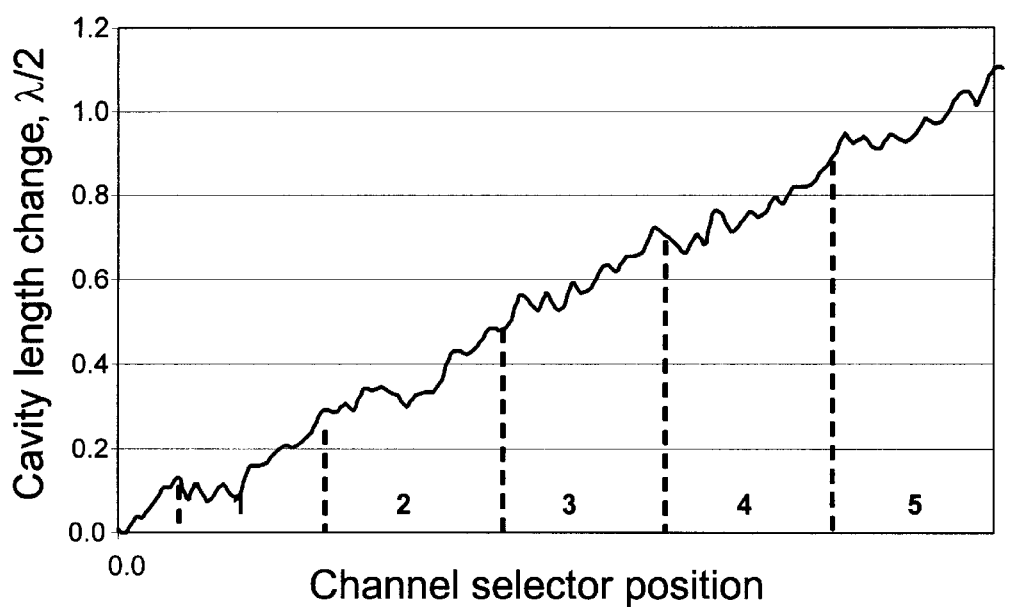
FIG. 6 is a diagram illustrating cavity length change as a function of channel selector position for a locked locally commensurate cavity.

A primary aspect of the present invention is to provide a condition under which the relative position of the lasing mode with respect to the transmission peak of the system (etalon+channel selector) does not change when the laser hops to an adjacent channel. In the other words, if the laser was locked to the transmission peak of the channel i in the vicinity of the boundary with the channel i+1, there is no need for cavity length readjustment to provide locking condition as it hops to the channel i+1, as shown in FIG. 6. This results from the continuity of the cavity length at the channel hop locations depicted by the dashed lines. If the above stated condition is met, the cavity is said to be "locally commensurate."

Figure 7:
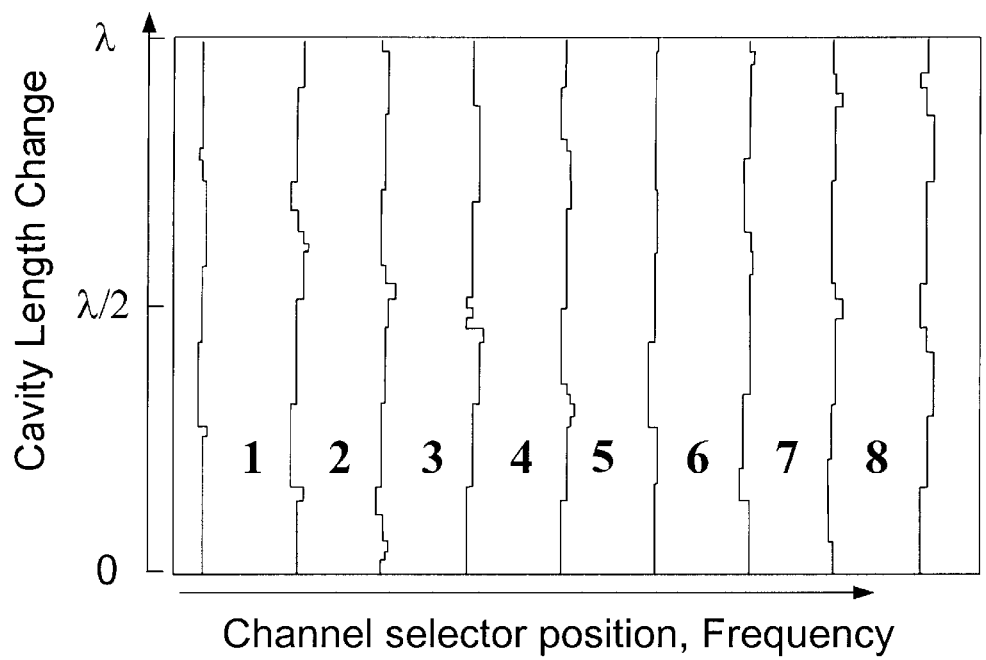
FIG. 7 is a diagram illustrating frequency as a function of channel selector position and cavity length change for locally commensurate cavity.

FIG. 7 shows experimental data for one embodiment of an ECDL laser configured to have a locally commensurate cavity, wherein the diagram depicts frequency as a function of channel selector position (horizontal) and cavity length change (vertical). One can see that neither the width of the channels nor their position depends on the optical length of the cavity. This laser exhibits very reliable channel tuning.

Figure 8:
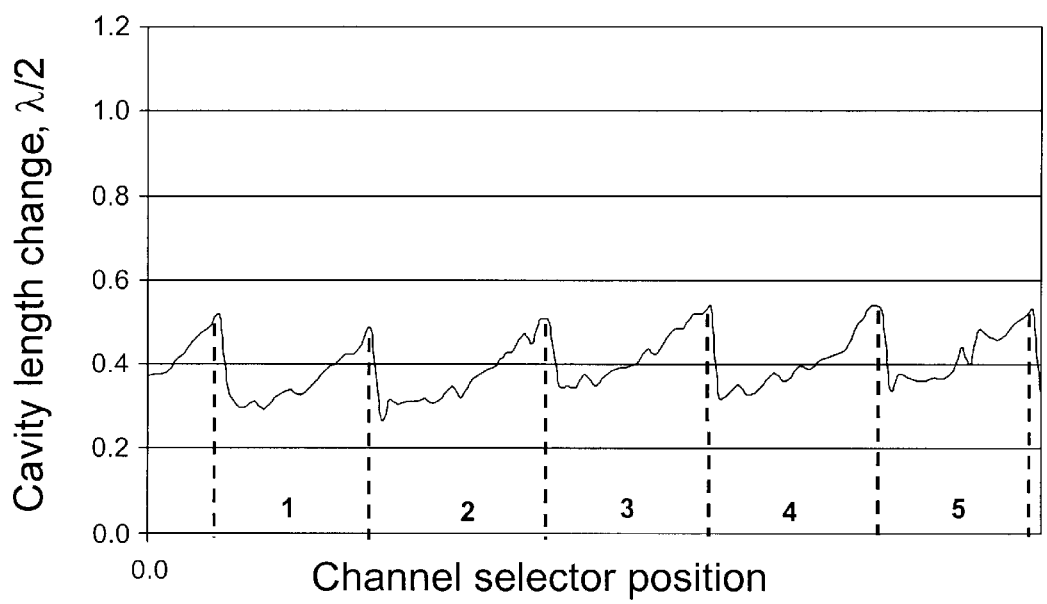
FIG. 8 is a diagram illustrating cavity length change as a function of channel selector position for a locked globally commensurate cavity.
Figure 9:
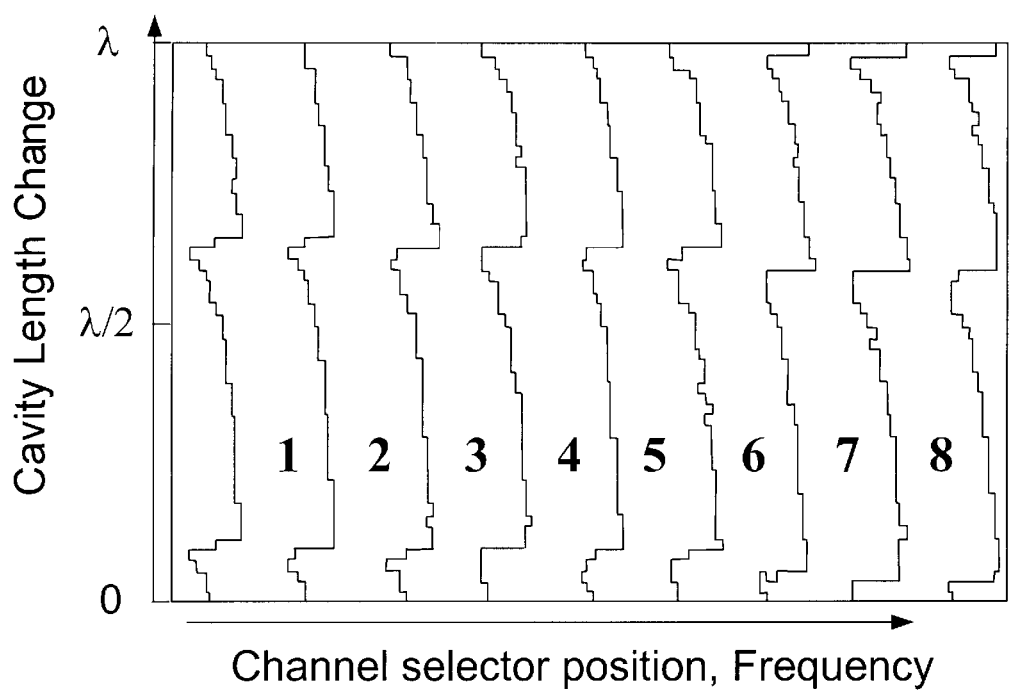
FIG. 9 is a diagram illustrating frequency as a function of channel selector position and cavity length change for a globally commensurate cavity.

If the FSR of the etalon is equal to an integer multiple of the FSR of the laser cavity:

$$FSR_{etalon} = N \times FSR_{cavity} \quad , (2)$$

the cavity is said to be "globally commensurate." The main distinctive feature of the globally commensurate state is the fact that the length of the locked cavity does not change (substantially) from channel to channel, as shown in FIG. 8. In general, the locally commensurate state differs from the globally commensurate state because of additional phase accumulation associated with the channel selector. FIG. 9 shows the experimental data for the laser frequency as a function of channel selector position (horizontal) and cavity length change (vertical) measured for globally commensurate cavity. One can see that although the width of the channels does not vary much, their position depends on the optical length of the cavity.

There are two effects that can contribute to the additional phase accumulation associated with channel selector:

a) Phase anomaly near the transmission resonance of the channel selector that results in a cavity mode pulling effect.

b) Frequency shift of the combined transmission peak of the etalon and the channel selector as the latter one moves with respect to the former one (shift of the reference frequency).

The relationship between the etalon FSR and the cavity FSR required to provide a locally commensurate condition should account for this additional phase accumulation Δφ:

$$FSR_{etalon} = FSR_{cavity}\left(N - \frac{\Delta\phi}{2\pi}\right), \quad (3)$$

where $$\Delta\phi = \Delta\phi_{pulling} - \Delta\phi_{frequency}. \quad (4)$$

In the case of a high finesse Fabry-Perot channel selector with a transmission peak full width half maximum (FWHM) much broader than that of the etalon and comparable with the FSR of the etalon, mode pulling dominates over frequency shift. Phase accumulation caused by the phase anomaly near the transmission resonance of the channel selector is proportional to the phase slope dφ/df averaged over the FSR of the etalon, as shown in FIG. 9.

$$\Delta\phi_{pulling} = 2\frac{d\phi}{df} \times FSR_{etalon} \qquad (5)$$

The difference between the optical path lengths (OPL) of the locally commensurate cavity and the OPL of the globally commensurate cavity can be derived from equations (2), (3), and (5):

$$\Delta OPL_{cavity} = -\frac{c}{2\pi}\frac{d\phi}{df}. \qquad (6)$$

In the example presented in FIG. 9 the average phase slope is about 10 radians per THz, which corresponds to $\Delta OPL_{cavity}$=−480 μm. Thus, the locally commensurate cavity is shorter than globally commensurate cavity by the amount defined by equation (6).

The difference between the optical path lengths (OPL) of the locally commensurate cavity and the OPL of the globally commensurate cavity can be derived from equations (2), (3), and (5):

$$\Delta OPL_{cavity} = -\frac{c}{2\pi}\frac{d\phi}{df}. \qquad (6)$$

In the example presented in FIG. 9 the average phase slope is about 10 radians per THz, which corresponds to $\Box OPL_{cavity}$=−480 $\Box$m. Thus, the locally commensurate cavity is shorter than globally commensurate cavity by the amount defined by equation (6).

If two intracavity etalons (or filters of other types) have similar FSRs with similar or equal finesse (like in the case of the Vernier tuning mechanism discussed above) phase accumulation associated with frequency shift of the combined transmission peak:

$$\Delta\phi_{frequency} = 2\pi\frac{\Delta f}{FSR_{cavity}} \qquad (7)$$

(here Δf is the frequency shift of the combined transmission peak across one channel) becomes comparable with the phase accumulation associated with mode pulling and total phase error becomes very small:

$$\Delta\phi \approx 0 \qquad (8)$$

For this type of laser configuration there is no difference between the locally and globally commensurate states.

In general, the exact relationship between the etalon FSR and the cavity FSR that provides locally commensurate condition can be derived using equations (3), (4), (5), (7), and (8). The cavity length of the laser is then adjusted according to this relationship. The tolerance for the cavity length adjustment is typically in the range of ±(0.05–0.10) *$OPL_{etalon}$. For example, for $FSR_{etalon}$=50 GHz ($OPL_{etalon}$=3 mm) this corresponds to an absolute tolerance in the range of ±(150–300) μm.

Here Δf is the channel selector peak frequency displacement, dT/df is the channel selector single pass transmittance slope, and $T_0$ is the channel selector relative transmittance at the channel hop location (in the case of Vernier tuning these are the synthetic Vernier filter parameters). Setting a maximal allowable $$\frac{\Delta f}{FSR_{etalon}},$$

one can derive a specification for the residual reflectivity of the gain chip facet from equation (9):

$$R_f = R_{ext}\left(\frac{dT}{df}\frac{FSR_{etalon}}{T_0}\right)^2\left(\frac{\Delta f}{FSR_{etalon}}\right)^2. \qquad (10)$$

There are three approaches to solving the gain chip AR-coated facet reflection problem. The first approach is to deposit a very efficient anti-reflection coating. In the approximation of small residual facet reflectivity $R_f$ compared to the reflectivity of the external cavity $R_{ext}$ ($R_f$<<$R_{ext}$) the expected channel boundary displacement can be estimated from the following formula:

$$\Delta f = T_0\left(\frac{dT}{df}\right)^{-1}\sqrt{\frac{R_f}{R_{ext}}}. \qquad (9)$$

Here Δf is the channel selector peak frequency displacement, dT/df is the channel selector single pass transmittance slope, and $T_0$ is the channel selector relative transmittance at the channel hop location (in the case of Pier tuning these are the synthetic Vernier filter parameters). Setting a maximal allowable $$\frac{\Delta f}{FSR_{etalon}},$$

one can derive a specification for the residual reflectivity of the gain chip facet from equation (9):

$$R_f = R_{ext}\left(\frac{dT}{df}\frac{FSR_{etalon}}{T_0}\right)^2\left(\frac{\Delta f}{FSR_{etalon}}\right)^2. \qquad (10)$$

Taking as an example $$\frac{\Delta f}{FSR_{etalon}} = 0.05$$

Figure 10:
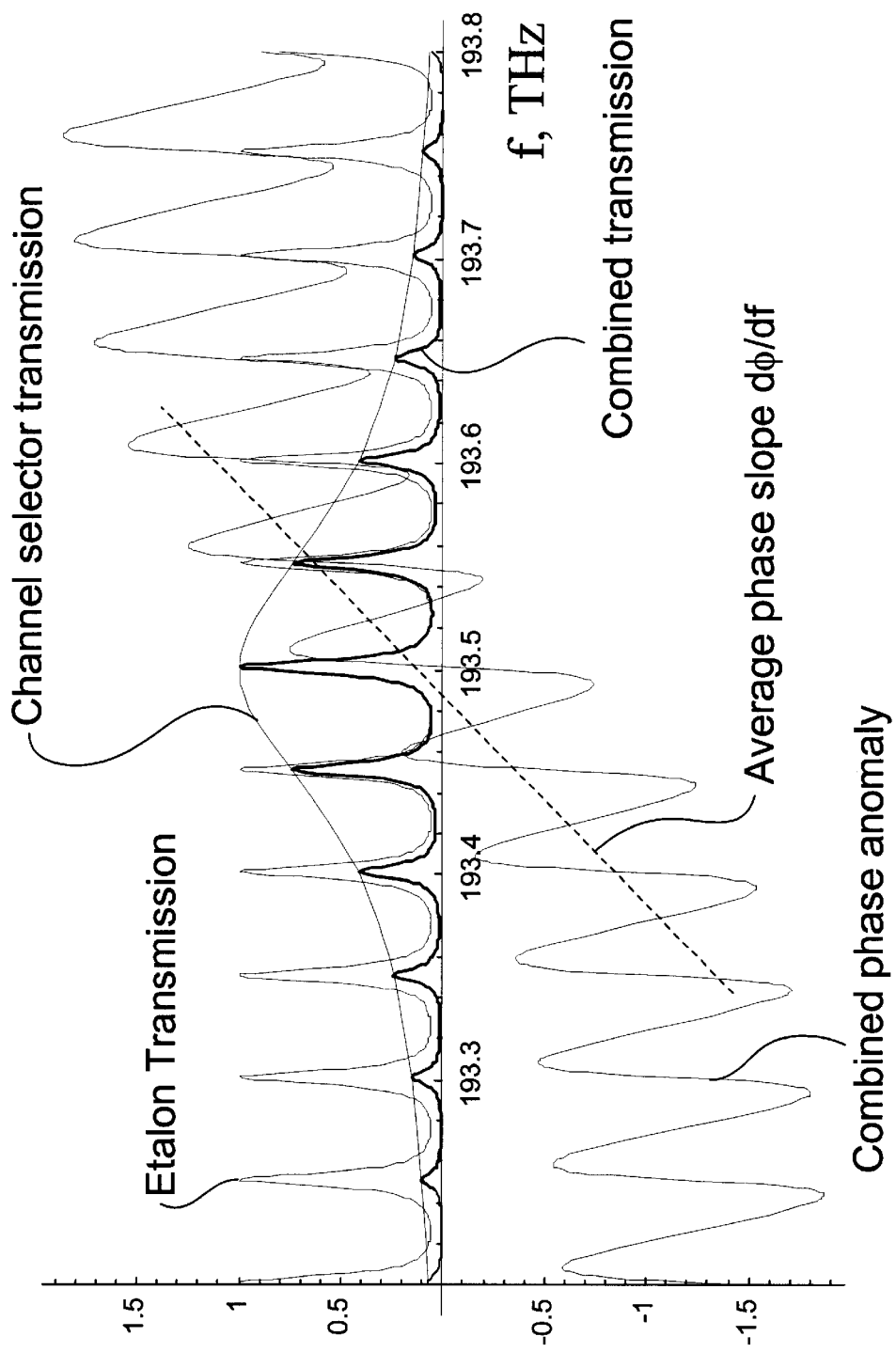
FIG. 10 is a diagram illustrating the phase anomaly for combined tuning filter elements of a laser (etalon+channel selector).

(35 5% channel boundary displacement), $R_{ext}$=0.3, and other parameters from FIG. 10: dT/df=5.8 THz$^{-1}$, $FSR_{etalon}$=50 GHz, $T_0$=0.91, one can come up with a residual reflectivity spec: $R_f$<7.6 10$^{-5}$. Note that this spec is much tighter than that derived based on laser stability criterion.

Figure 11:
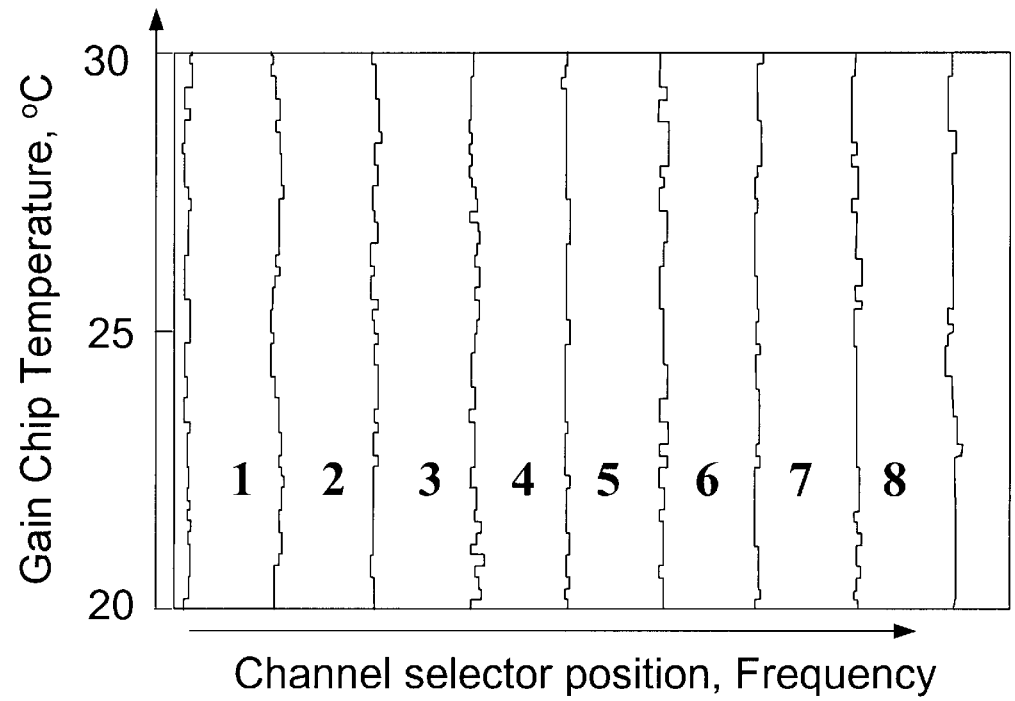
FIG. 11 is a diagram illustrating frequency as a function of channel selector position and gain chip temperature for a locked laser with $FSR_{chip}/FSR_{etalon}=1.5$ and a bent waveguide chip.

The second approach is to use gain chips with an angled (bent) or curved waveguide. In these chips the waveguide intersects the facet of the chip at an angle, providing that the reflected light is not coupled back to the waveguide. Reduction of effective reflectivity by a factor of 1000 has been achieved in these devices. In combination with a low-cost one layer AR coating, this approach can provide effective reflectivity of less than 2*10$^{-5}$. FIG. 11 shows experimental data for laser frequency as a function of channel selector position (horizontal) and gain chip temperature (vertical) measured with a bent waveguide chip. One can see that neither the width of the channels nor their position depends on the phase of the facet reflection controlled by the chip temperature.

The third approach does not require very good coating or angled waveguide structure. Instead, it ensures that light reflected from the gain chip facet has the same phase difference with light reflected from the external cavity for all channels. This condition can be provided if the free spectral range of the etalon is equal to an integer multiple of the free spectral range of the gain chip:

$$FSR_{etalon} = N \times FSR_{chip} \qquad (11)$$

Figure 12:
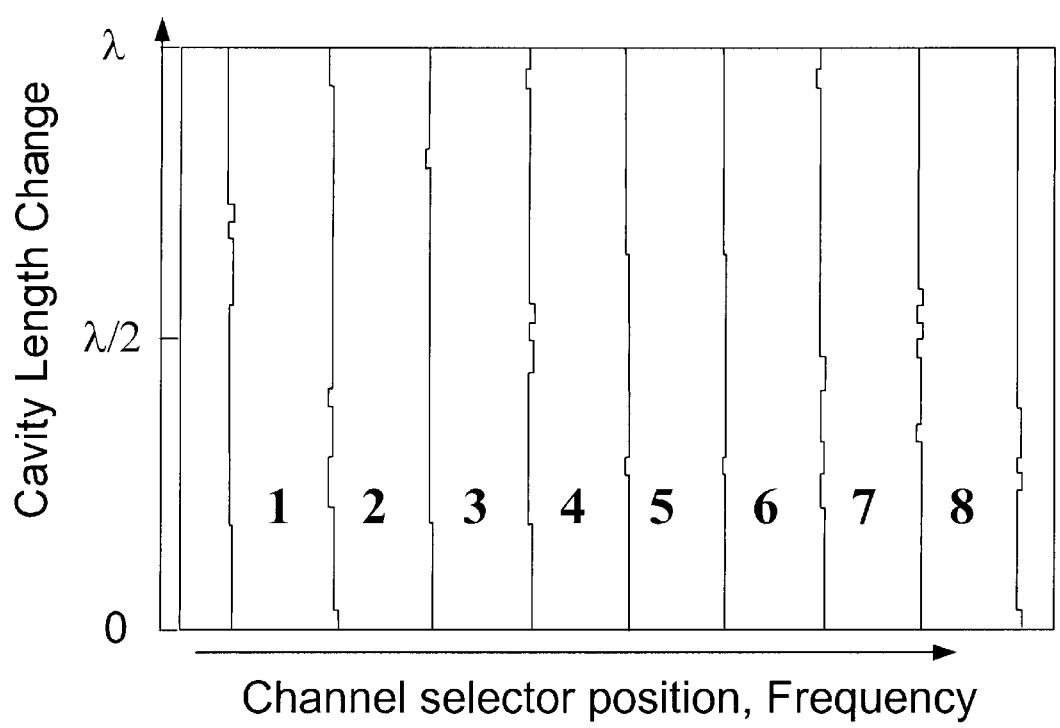
FIG. 12 is a diagram illustrating frequency as a function of channel selector position and gain chip temperature for the locked laser with $FSR_{etalon}=FSR_{chip}$ and Fabry-Perot chip with $R_f=9*10^{-4}$.

FIG. 12 shows experimental data for laser frequency as a function of channel selector position (horizontal) and gain chip temperature (vertical) measured in a cavity that meets the condition defined by equation (11). One can see that neither the width of the channels nor their position depends on the phase of the facet reflection controlled by the chip temperature.

The tolerance for the gain chip OPL adjustment is typically in the range of $\pm(0.05-0.10)*OPL_{etalon}$. For $FSR_{etalon} = 50$ GHz ($OPL_{etalon} = 3$ mm) and the gain medium refractive index n=3.5 this corresponds to an absolute tolerance in the range of $\pm(43-86)$ μm. It is important to mention that even if the condition defined by equation (11) is met, the reflectivity of the chip facet cannot be made arbitrary high. Stable laser operation with high side mode suppression ratio still require it to be low as compared to the external cavity reflectivity, but the reflectivity specification can generally be relaxed by at least one order of magnitude.

The teachings and principles of the invention disclosed herein may be implemented in ECDL lasers having a general configuration similar to that discussed above with reference to ECDL 100. For example, with reference to FIG. 13, an ECDL 1300 in shown including various elements common to ECDL 100 having like reference numbers, such as a gain diode chip 102, lenses 108, 116, and 120, etc. The various optical components of the ECDL 1300 are mounted or otherwise coupled to a thermally-controllable base or "sled" 1316. In one embodiment, one or more thermal-electric cooler (TEC) elements 1318, such as a Peltier element, are mounted on or integrated in sled 1316 such that the temperature of the sled can be precisely controlled via an input electrical signal. Due to the expansion and contraction of a material in response to a temperature change, the length of the sled can be adjusted very precisely. Adjustment of the length results in a change in the distance between partially reflective front facet 104 and reflective element 114, which produces a change in the optical path length of the laser cavity. As a result, controlling the temperature of the sled can be used to provide fine adjustment of the frequency of the lasing mode, such as used in the channel-locking mode discussed above.

In general, temperature control of the sled will be used for very fine tuning adjustments, while coarser tuning adjustments will be made by means of tuning filter elements 110. Generally, tuning filter elements may comprise one or more etalons, gratings, prisms or other element or elements that are capable of providing feedback to gain medium 102 along at a selected wavelength or sets of wavelengths. The tuning filter element(s) 110 are controlled by a wavelength selection control block 1342, which in turn is coupled to or included as part of a controller 1320. In response to an input channel command 1344, the controller and/or wavelength selection control block adjust the tuning filter element(s) so as to produce a lasing mode corresponding to the desired channel frequency.

In general, the tunable ECDLs may employ a wavelength-locking (also referred to as channel-locking) scheme so as to maintain the laser output at a selected channel frequency (and thus at a corresponding predetermined wavelength). Typically, this may be provided via a "phase modulation" scheme, wherein the optical path length of the laser cavity is modulated at a relatively low frequency (e.g., 500 Hz–20 KHz) at a small frequency excursion. In one embodiment, an optical path length modulator 1313 is employed for this purpose. In response to a modulated wavelength locking excitation signal 1322 generated by controller 1320 and amplified by an amplifier 1324, the optical path length of modulator 1313 is caused to modulate, thereby inducing a wavelength modulation and in the laser's output. Generally, the optical path length modulator may comprise an element that changes its optical path length in response to an electrical input, such as a Lithium Niobate (LiNbO$_3$) phase modulator. Lithium Niobate is a material that changes its index of refraction (ratio of the speed of light through the material divided by the speed of light through a vacuum) when a voltage is applied across it. As a result, by providing a modulated voltage signal across the LiNbO$_3$ phase modulator, the optical path length of the external laser cavity can be caused to modulate. Other means of modulating the optical path length of the laser cavity may be employed as well, such as modulating the location of reflective element 114 (e.g., via a MEMS mirror or a reflector coupled to a piezo-electric actuator). Another technique is to employ a gain medium with a phase control section that changes its optical path length in response to an injected current.

As is well-known, when the laser's output has a frequency that is centered on a channel frequency (in accordance with appropriately configured filter elements), the laser intensity is maximized relative to non-centered outputs. As a result, the wavelength modulation produces an intensity modulation having an amplitude indicative of how off-center the lasing mode is. A corresponding feedback signal may then be generated that is received by controller 1520 and processed to adjust the overall cavity length via a sled temperature control signal 1330.

Figure 13:
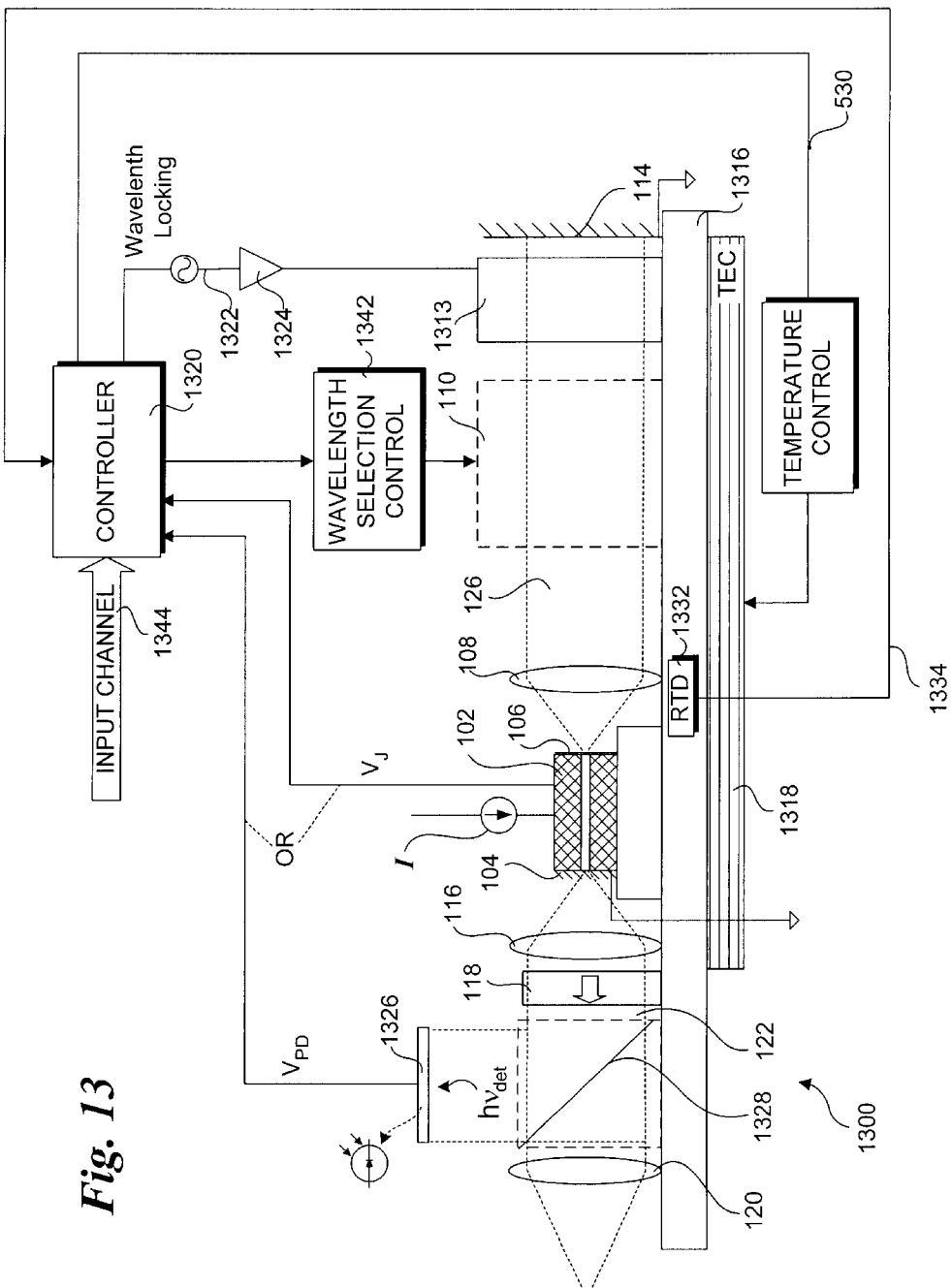
FIG. 13 is a schematic diagram of an ECDL in accordance with one embodiment of the invention that may be configured to produce a locally commensurate condition.

For example, in the illustrated embodiment of FIG. 13, a photodetector 1326 is used to detect the intensity of the laser output. A beam splitter 1328 is disposed in the optical path of output beam 122, causing a portion of the output beam light to be redirected toward photodetector 1326. In one embodiment, photodetector 1326 comprises a photo diode, which generates a voltage charge in response to the light intensity it receives (hv$_{det}$). A corresponding voltage V$_{PD}$ is then fed back to controller 1320.

Controller 1320 includes a digital servo loop (e.g., phase lock loop) that is configured to adjust the temperature of sled 1316 such that the amplitude modulation of the light intensity detected at photodectector 1326 is minimized, in accordance with a typical intensity vs. frequency curve for a given channel and corresponding filter characteristics. In an optional embodiment, the junction voltage across gain diode chip (V$_J$) is employed as the intensity feedback signal, rather than V$_{PD}$. An error signal is then derived by based on the amplitude modulation and phase of V$_{PD}$ or V$_J$ in combination with modulated signal 1322. In response to the error signal, an appropriate adjustment in temperature control signal 1330 is generated. Adjustment of the sled temperature causes a corresponding change in the overall (continuous) cavity length, and thus the lasing frequency. This in turn results in (ideally) a decrease in the difference between the lasing frequency and the desired channel frequency, thus completing the control loop. To reach an initial condition, or for a second feedback signal, a resistive thermal device (RDT) 1332, such as a thermister or thermocouple, may be used to provide a temperature feedback signal 1334 to controller 1320.

In general, various tuning filter elements and corresponding tuning adjustment techniques may be employed for channel selection purposes. For example, in an ECDL 1400 shown in FIG. 14, tuning filter elements 110 comprise first and second tunable filters $F_1$ and $F_2$. In one embodiment, filters $F_1$ and $F_2$ comprise respective etalons, either made of a solid material or being gas filled. In one embodiment, filter tuning is effectuated by changing the optical path length of each etalon. This in turn may be induced by changing the temperature of the etalons.

For example, ECDL 1400 now shows further details of an exemplary channel selection subsystem. It is noted that although the wavelength selection control block is shown external to controller 1420, the control aspects of this block may be provided by the controller alone. Wavelength selection control block 1442 provides electrical outputs 1404 and 1406 for controlling the temperatures of filters $F_1$ and $F_2$, respectively. In one embodiment, a temperature control element is disposed around the perimeter of a circular etalon, as depicted by TECs 1408 and 1410. Respective RTDs 1412 and 1414 are employed to provided a temperature feedback signal back to wavelength selection control block 1442.

Generally, etalons are employed in laser cavities to provide filtering functions. As discussed above, they essentially function as Fabry-Perot resonators, and provide a filtering function defining a set of transmission peaks in the laser output. The FSR spacing of the transmission peaks is dependent on the distance between the two faces of the etalon, e.g., faces 1416 and 1418 for filter $F_1$, and faces 1420 and 1422 for filter $F_2$. As the temperatures of the etalons change, the etalon material is caused to expand or contract, thus causing the distance between the faces to change. This effectively changes the optical path length of the etalons, which may be employed to shift the transmission peaks.

The effect of the filters is cumulative. As a result, all lasing modes except for a selected channel lasing mode can be substantially attenuated by lining up a single transmission peak of each filter. In one embodiment, the configurations of the two etalons are selected such that the respective fee spectral ranges of the etalons are slightly different. This enables transmission peaks to be aligned under a Vernier tuning technique similar to that employed by a Vernier scale. In one embodiment, one of the filters, known as a "grid generator," is configured to have a free spectral range corresponding to a communications channel grid, such as the ITU wavelength grid. This wavelength grid remains substantially fixed by maintaining the temperature of the corresponding grid generator etalon at a predetermined temperature. At the same time, the temperature of the other etalon, known as the channel selector, is adjusted so as to shift its transmission peaks relative to those of the grid generator. By shifting the transmission peaks of the filters in this manner, transmission peaks corresponding to channel frequencies may be aligned, thereby producing a cavity lasing mode corresponding to the selected channel frequency. In another embodiment, the transmission peaks of both the filters are shifted to select a channel.

Generally, either of these schemes may be implemented by using a channel-etalon filter temperature lookup table in which etalon temperatures for corresponding channels are stored, as depicted by lookup table 1424. Typically, the etalon temperature/channel values in the lookup table may be obtained through a calibration procedure, through statistical data, or calculated based on tuning functions fit to the tuning data. In response to input channel selection 1344, the corresponding etalon temperatures are retrieved from lookup table 1424 and employed as target temperatures for the etalons using appropriate temperature control loops, which are well-known in the art.

Figure 15:
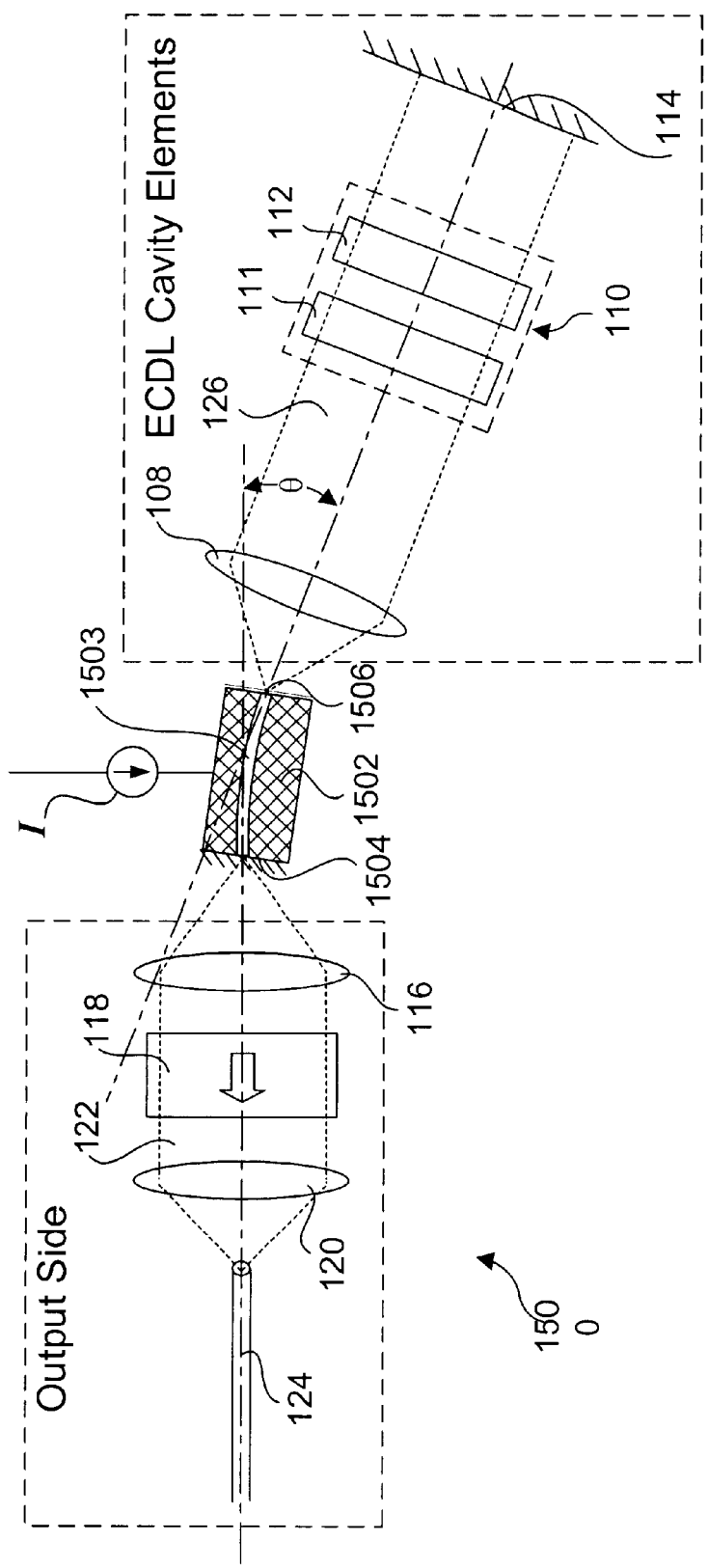
FIG. 15 is a schematic diagram illustrating an overview of an ECDL in which a gain medium chip with a bent waveguide is employed.

An ECDL 1500 illustrating an exemplary configuration of an ECDL that employs a gain medium chip 1502 with a bent waveguide 1503 is shown in FIG. 15. The gain medium chip also includes a partially-reflective front facet 1504 and a non-reflective rear facet 1506. In general, the various ECDL cavity elements and output side elements are similar to those discussed in the prior embodiments that employ a gain medium chip having a linear waveguide, except that there is an angle $\theta$ between the centerlines of both sets of elements. In one embodiment $\theta$ is approximately 20 degrees.

Figure 16:
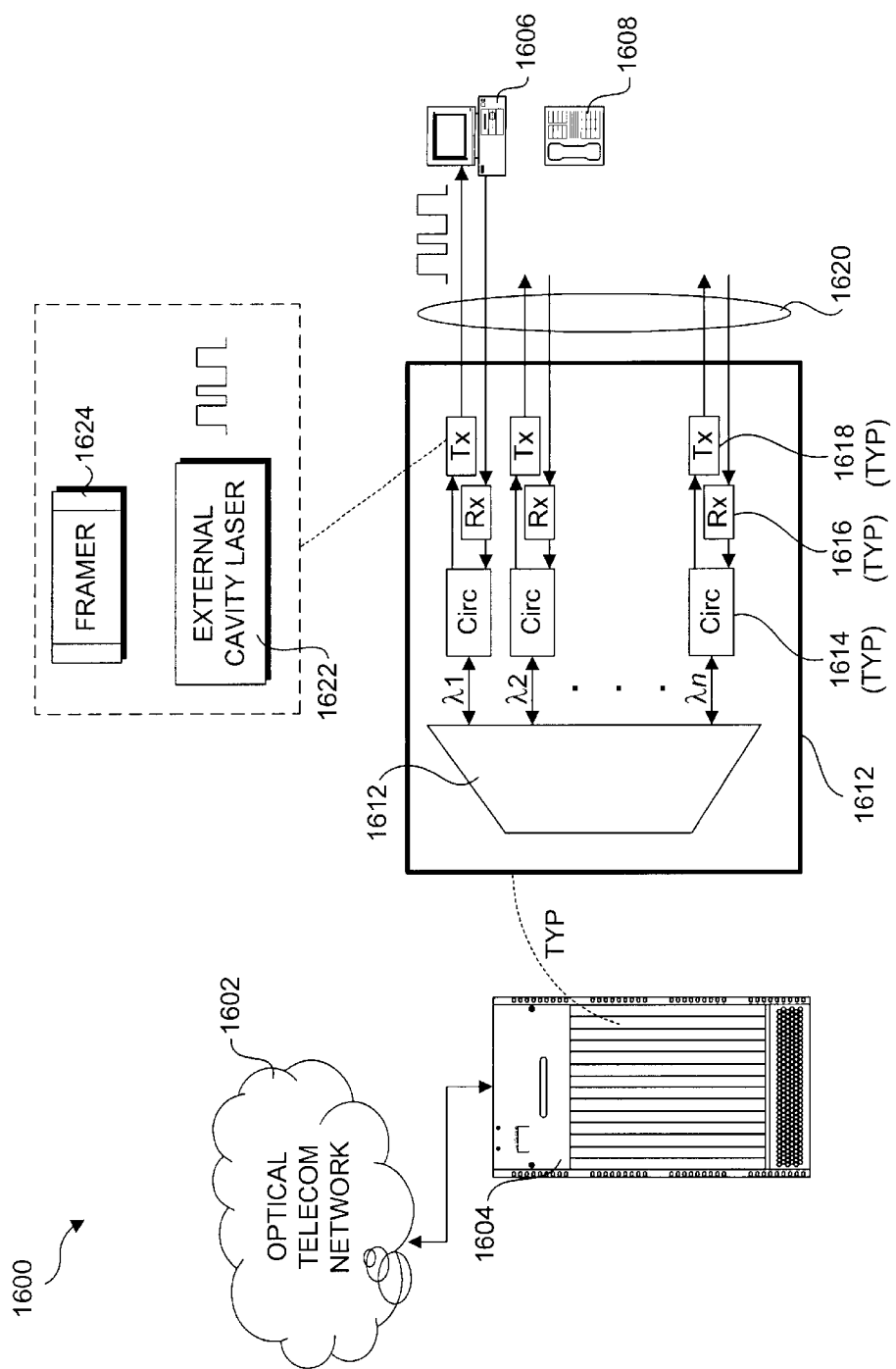
FIG. 16 is a schematic diagram of a communication network including a network switch in which tunable external cavity lasers in accordance with embodiments of the invention may be deployed.
Figure 13:
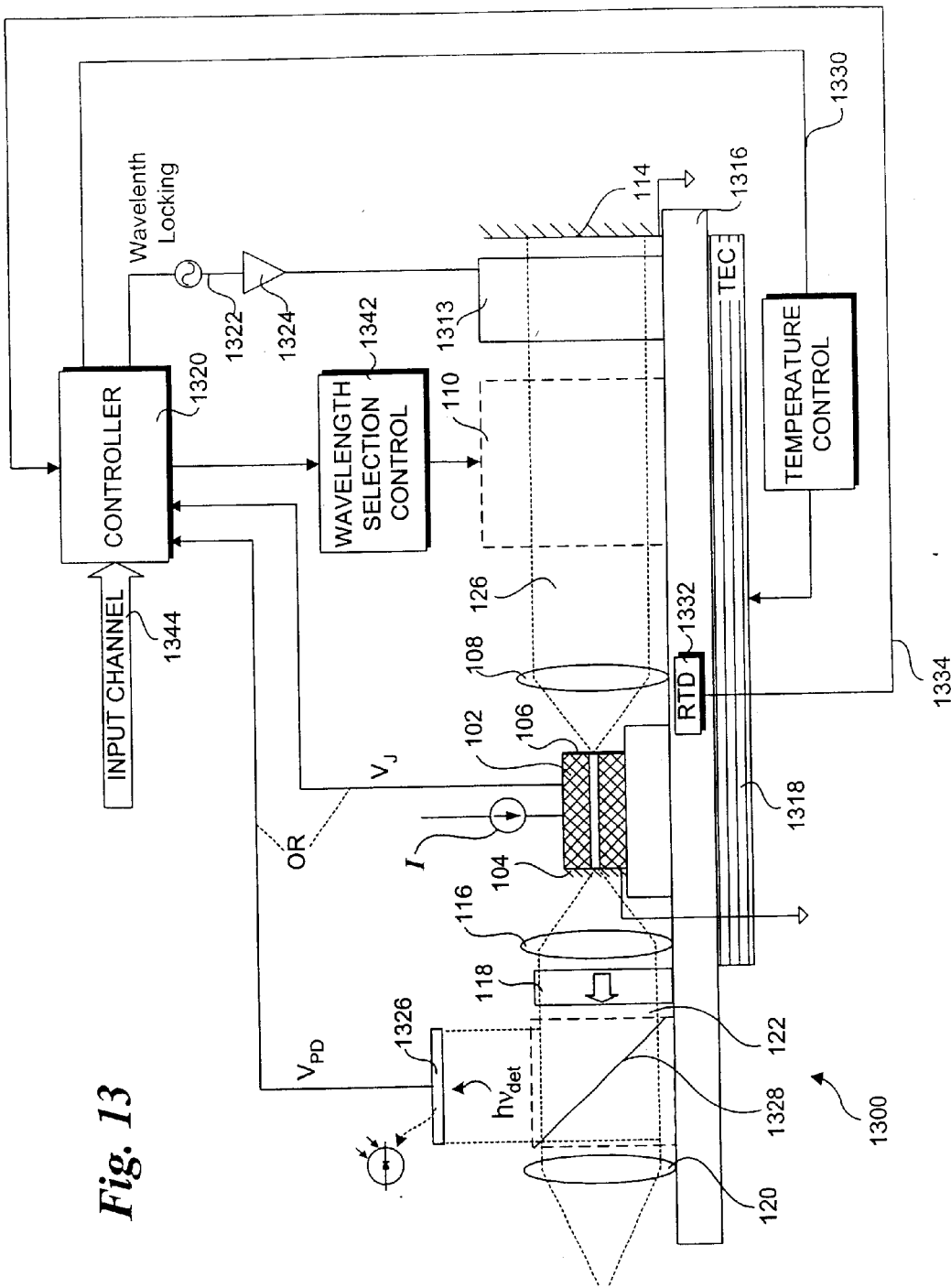
Figure 14:
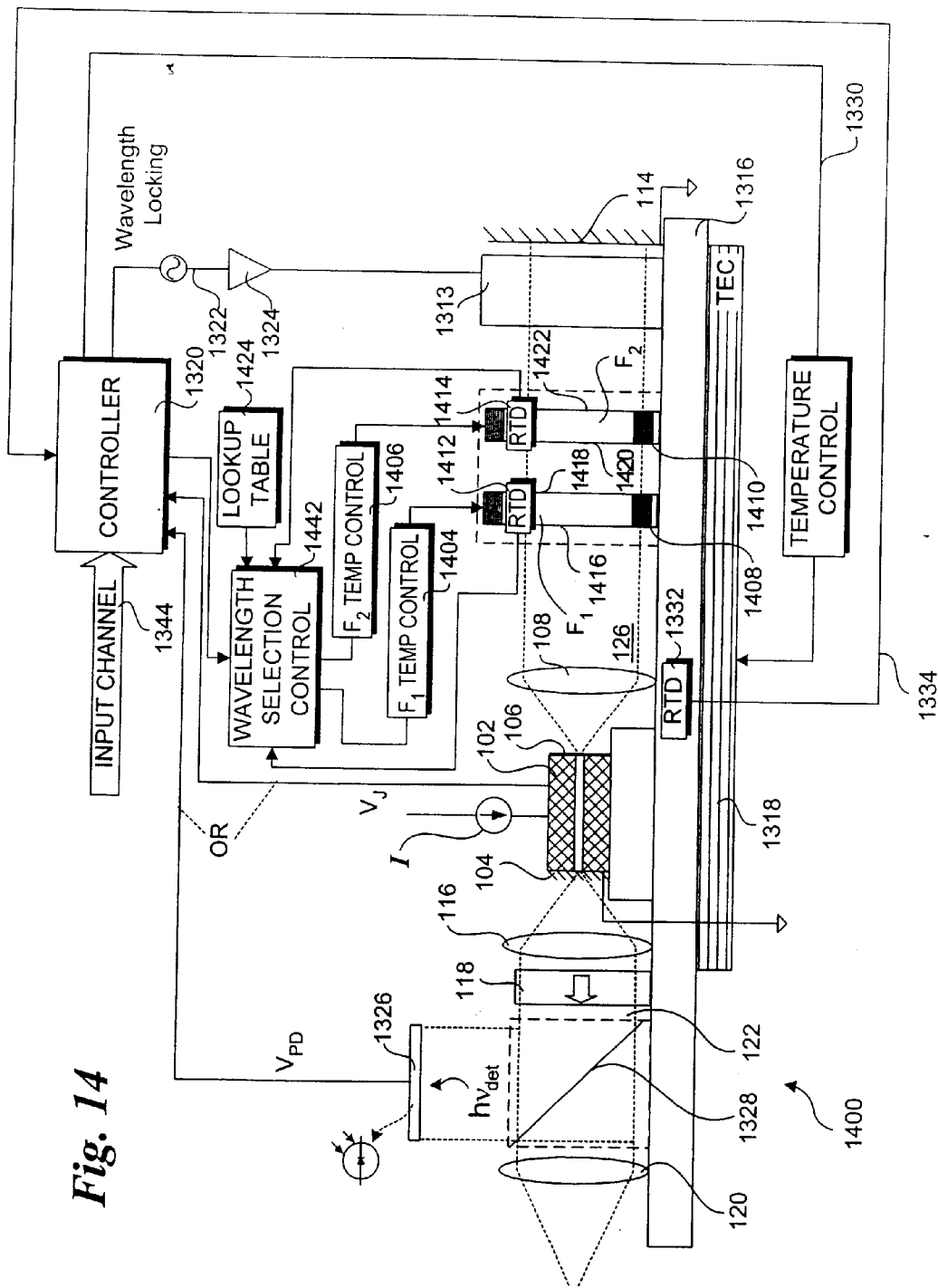

FIG. 16 shows a communication system 1600 in accordance with an embodiment of the invention in which an optical network is coupled to a plurality of data and voice subscribers lines by an optical mux/demux utilizing ECDL's tunable to the center frequency of any of the WDM channels on the optical network. The communication system includes an optical network 1602, a network switch 1604, a data terminal 1606, and a voice terminal 1608. The modulated data may be carried on a number of channels in multiple access protocols including but not limited to: wavelength division multiplexing (WDM), dense wavelength division multiplexing (DWDM), frequency division multiple access (FDMA), etc. Currently, this expansion of bandwidth is primarily being accomplished by WDM, in which separate subscriber/data session may be handled concurrently on a single optical fiber by means of modulation of each of those subscriber datastreams on different portions of the light spectrum. The precise center frequencies of each channel are specified by standard setting organizations such as the International Telecommunications Union (ITU). The center frequencies are set forth as part of a wavelength grid that defines the center frequencies and spacing between channels. Typically, the grid spacing is even and occurs at integer multiples of a selected fundamental frequency.

Network switch 1604 provides network switching operations, as is well-known in the art. This is facilitated by optical transceivers that are mounted on fiber line cards 1610. Each fiber line card includes a multi-state multiplexer/demultiplexer (mux/demux) 1612, a circulator bank including circulators 1614, a receiver bank including receivers 1616, and a transmitter bank including transmitters 1618. The mux/demux is a passive optical device that divides wavelengths (or channels) from a multi-channel optical signal, or combines various wavelengths (or channels) on respective optical paths into one multi-channel optical signal depending on the propagation direction of the light.

In the receive mode, after de-multiplexing, each individual channel is passed via a corresponding circulator 1614 within the circulator bank to a corresponding receiver 1616 in the receiver bank. Each receiver 1616 includes a narrow bandpass photodetector, framer, and decoders (not shown). Switches (not shown) couple the receiver over a corresponding one of subscriber lines 1620 to a voice or data terminal 1606 or 1608, respectively.

In the transmit mode, each line card transmitter bank includes a bank of lasers 1622, including n (e.g., 128) ECLs radiating light at one of the selected center frequencies of each channel of the telecommunications wavelength grid. The wavelength range of current ITU-defined grids is 1525–1575 nm. Each subscriber datastream is optically modulated onto the output beam of a corresponding ECL having a construction and operation in accordance with the embodiments of the invention discussed above. A framer 1624 permits framing, pointer generation and scrambling for transmission of data from the bank of ECLs and associated drivers. The modulated information from each of the lasers is passed via a corresponding circulator into mux/demux 1612, which couples the output to a single optical fiber for transmission. The operation of the fiber line card in the embodiment shown is duplex, meaning that bidirectional communications are possible.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

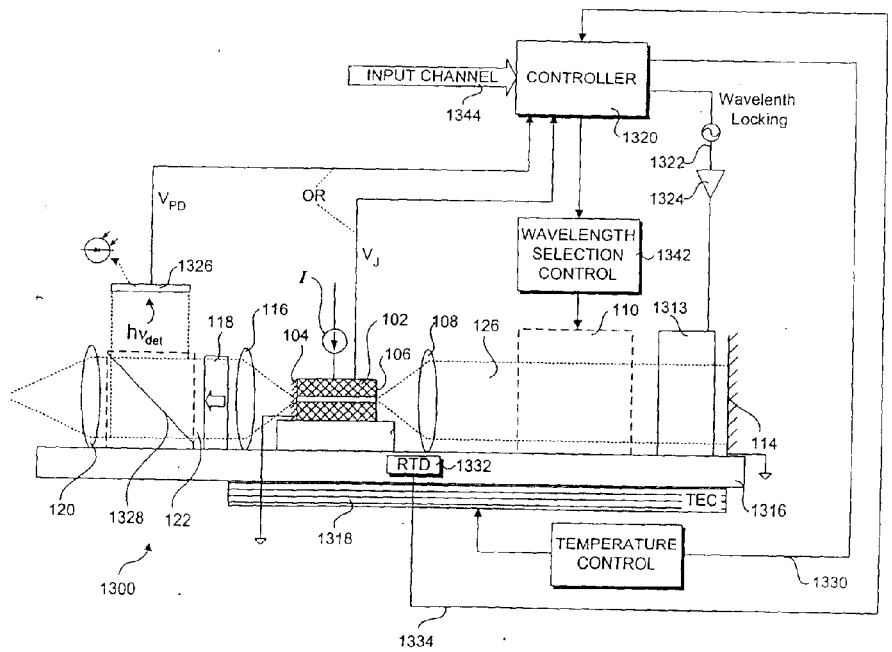

What is claimed is:

1. A tunable laser, comprising:
   a gain medium pumped to emit a plurality of photons in response to an electrical input;
   a first optical cavity, optically coupled to the gain medium, in which said plurality of photons resonate in accordance with a plurality of lasing modes, said first optical cavity having a first free spectral range;
   a second optical cavity optically coupled to the first optical cavity and having a second free spectral range that is substantially equal to an integer multiple of the first free spectral range; and
   a channel selector optically coupled to the first and second optical cavities, adjustable to select a lasing mode from among said plurality of lasing modes having a frequency corresponding to a selected channel,
   wherein the relationship between the free spectral ranges of the first and second optical cavities produces a globally commensurate condition under which changes between communication channels having respective wavelengths are effectuated substantially without requiring adjustment to an optical length of the first optical cavity.

2. The tunable laser of claim 1, wherein the second optical cavity and the channel selector respectively comprises first and second etalons.

3. The tunable laser of claim 2, wherein the first and second etalons are independently tuned to select a channel by aligning a transmission peak of the first etalon with a transmission peak of the second etalon.

4. The tunable laser of claim 1, wherein the second optical cavity and the channel selector respectively comprise first and second optical filters, said first filter having a plurality of transmission peaks spanning a selected frequency range, said second filter having a single transmission peak adjustable within the selected frequency range, and tuning is performed by shifting the single transmission peak of the second filter relative to a plurality of transmission peaks of first filter to align the single transmission peak of the second filter with one of the plurality of transmission peaks of the first filter.

5. The tunable laser of claim 1, wherein the second optical cavity and the channel selector comprise a Vernier tuning mechanism including respective first and second optical filters having respective sets of transmission peaks having slightly different free spectral ranges and similar finesses, and wherein tuning is performed by shifting the set of transmission peaks of the second optical filter relative to the set of transmission peaks of first optical filter to align a single transmission peak of each of the first and second sets of transmission peaks.

6. The tunable laser of claim 1, wherein the first optical cavity comprises a laser cavity having a free spectral range $FSR_{cavity}$, and the second optical cavity comprises an etalon having a free spectral range $FSR_{etalon}$, and wherein the laser cavity and the etalon are related such that:

$$FSR_{etalon} = FSR_{cavity}\left(N - \frac{\Delta\phi}{2\pi}\right)$$

wherein N is an integer and $\Delta\phi$ represents an additional phase accumulation associated with the channel selector.

7. The tunable laser of claim 1, wherein the combination of the second optical cavity and the channel selector comprise a tunable filter by which a single lasing mode may be selected to produce a laser output having a frequency in accordance with a set of communication channels, and wherein the width of the channels are substantially independent of an optical length of the laser cavity.

8. The tunable laser of claim 1, wherein the second optical cavity comprises an etalon that defines a filter having a plurality of transmission peaks corresponding to a standard optical communication channel grid.

9. The tunable laser of claim 1, wherein the gain medium comprises a laser diode.

10. The tunable laser of claim 9, wherein the laser diode comprises a Fabry-Perot laser diode having a partially-reflective front facet and a rear facet coated with an anti-reflective coating, and wherein the first optical cavity is formed by the partially-reflective front facet and a reflective element disposed opposite the rear facet.

11. The tunable laser of claim 10, wherein the second optical cavity comprises an etalon disposed between the laser diode rear facet and the reflective element.

12. The tunable laser of claim 9, wherein the laser diode comprises a Fabry-Perot laser diode having a partially-reflective front facet and rear facet, and wherein the first optical cavity is formed by the partially-reflective front facet and a reflective element disposed opposite the rear facet, and wherein the second optical cavity is formed by the front and rear facets of the laser diode.

13. The tunable laser of claim 12, further comprising a wavelength selection element disposed within the first optical cavity.

14. The tunable laser of claim 1, wherein the channel selector comprises a wedge-shaped etalon coupled to an electro-mechanical actuator.

15. The tunable laser of claim 1, wherein the channel selector comprises an etalon having a variable optical path length that may be adjusted in response to an electrical input.

16. The tunable laser of claim 15, wherein the etalon is made of a material that changes its index of refraction in response to an electrical input.

17. A tunable external cavity diode laser (ECDL), comprising:
   a base;
   a laser diode gain chip operatively coupled to the platform having a partially-reflective front facet, pumped to emit light in response to an electrical input;
   a reflective element positioned parallel with the partially-reflective front facet and operatively coupled to the base, said reflective element and the partially-reflective front facet defining a laser cavity; and an etalon disposed in the laser cavity and operatively coupled to the base, wherein the etalon has a free spectral range that is substantially equal to an integer multiple of a free spectral range of the laser cavity.

18. The tunable ECDL of claim 17, further comprising a channel selector operatively coupled to the base.

19. The tunable ECDL of claim 18, wherein the combination of the channel selector and etalon comprise a tunable filter by which a single lasing mode may be selected to produce a laser output having a frequency in accordance with a set of communication channels, and wherein the width of the channels are substantially independent of an optical length of the laser cavity.

20. The tunable ECDL of claim 18, wherein the laser cavity has a free spectral range $FSR_{cavity}$, and the etalon has a free spectral range $FSR_{etalon}$, and wherein the laser cavity and etalon are related such that:

$$FSR_{etalon} = FSR_{cavity}\left(N - \frac{\Delta\phi}{2\pi}\right)$$

wherein N is an integer and $\Delta\phi$ represents an additional phase accumulation associated with the channel selector.

21. The tunable ECDL of claim 18, wherein the etalon and the channel selector comprise a Vernier tuning mechanism including respective first and second optical filters having respective sets of transmission peaks having slightly different free spectral ranges and similar finesses, and wherein tuning is performed by shifting the set of transmission peaks of the second optical filter relative to the set of transmission peaks of first optical filter to align a single transmission peak of each of the first and second sets of transmission peaks.

22. The tunable ECDL of claim 17, wherein the etalon comprises a grid generator comprising a filter having a plurality of transmission peaks aligned with corresponding communication channel frequencies defined by an optical communication standard.

23. The tunable external cavity laser of claim 17, wherein the laser diode gain chip includes a curved or bent waveguide.

24. The tunable external cavity laser of claim 17, wherein the laser diode gain chip comprises a Fabry-Perot resonator including a rear facet disposed opposite the front facet, and wherein the rear facet is coated with an anti-reflective coating that sufficiently reduces internal reflections at the rear facet such that a phase difference between a lasing mode for the laser cavity and a lasing mode of the laser diode gain chip substantially.

25. The tunable external cavity laser of claim 17, wherein the laser diode gain chip defines a Fabry-Perot cavity including a rear facet disposed opposite the front facet and having a free spectral range, and wherein the free spectral range of the etalon is substantially equal to an integer multiple of the free spectral range of the cavity.

26. A method for configuring a laser tunable to a plurality of discrete channels at respective wavelengths, said laser including a plurality of Fabry-Perot optical cavities, comprising:

selecting respective free spectral ranges for each of the plurality of Fabry-Perot optical cavities to produce a locally commensurate condition under which there is substantially no need to adjust a cavity optical length of the laser to provide respective channel locking conditions as the laser hops between adjacent channels; and configuring optical elements in the laser to produce the plurality of Fabry-Perot optical cavities having the respective free spectral ranges that are selected.

27. The method of claim 26, wherein frequency widths between adjacent channels are substantially independent of the cavity optical length of the laser.

28. The method of claim 27, wherein the optical cavities include an etalon and a laser cavity in which the etalon and a channel selector are disposed, said channel selector inducing an additional phase accumulation in the laser cavity lasing modes of $\Delta\phi$, further comprising:

determining $\Delta\phi$; and selecting the free spectral ranges such that $$FSR_{etalon} = FSR_{cavity}\left(N - \frac{\Delta\phi}{2\pi}\right)$$

where $FSR_{cavity}$ is the free spectral range of the cavity, $FSR_{etalon}$ is the free spectral range of the etalon, and N is an integer.

29. The method of claim 26, wherein the optical cavities include a Fabry-Perot gain chip and an etalon, and the free spectral range of the etalon is selected to be an integer multiple of the free spectral range of the gain chip.

* * * * *

UNITED STATES PATENT AND TRADEMARK OFFICE
CERTIFICATE OF CORRECTION

PATENT NO. : 6,665,321 B1
DATED : December 16, 2003
INVENTOR(S) : Sochava et al.

It is certified that error appears in the above-identified patent and that said Letters Patent is hereby corrected as shown below:

Replace the Title page with the attached Title page.

Figure 14:
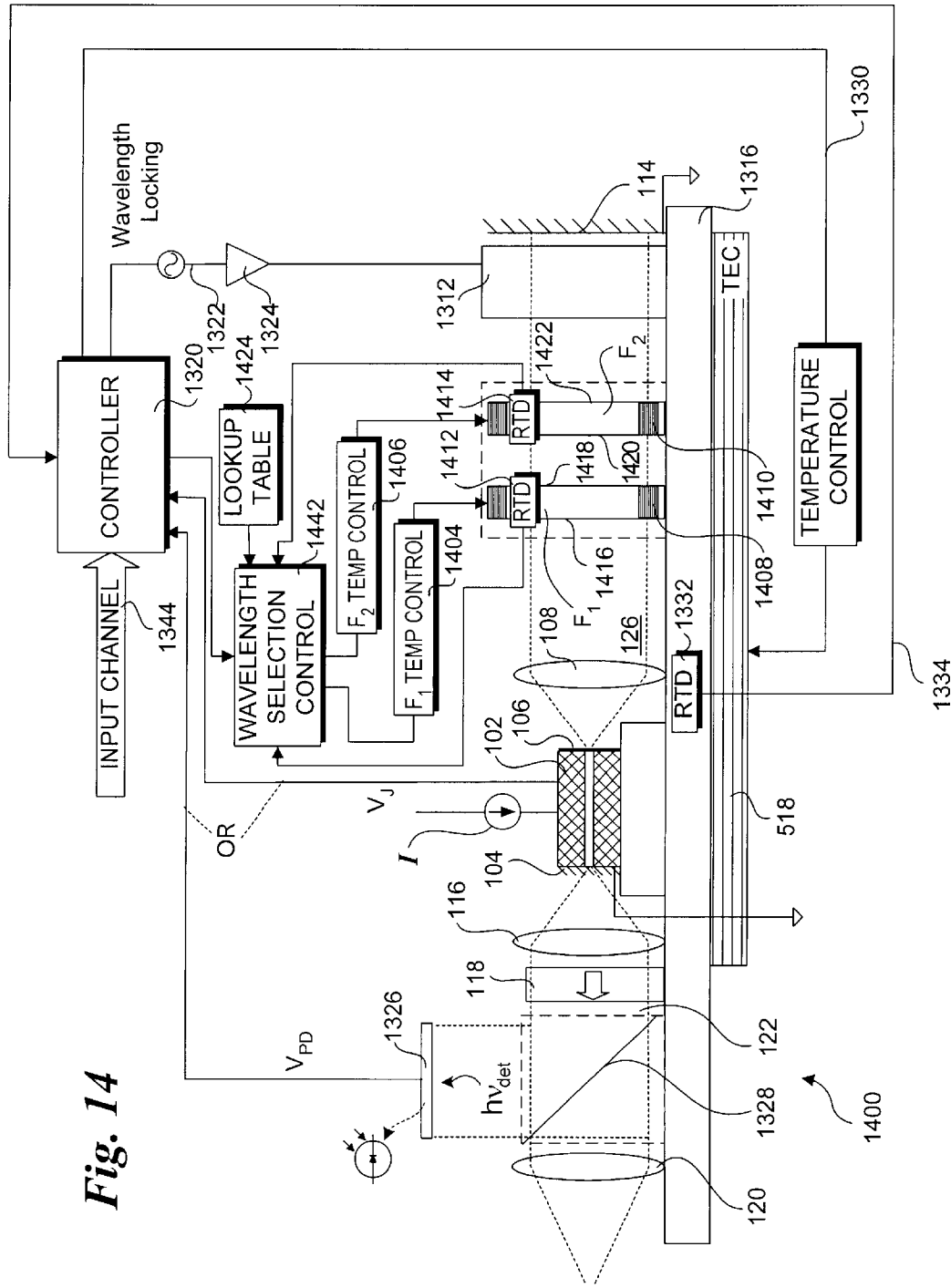
FIG. 14 is a schematic diagram of an ECDL illustrating further details of a channel selection scheme that employs a pair of adjustable etalons.

<u>Drawings,</u>
Replace Figs. 13 and 14 with the attached new drawings of Figs. 13 and 14.

<u>Column 9,</u>
Line 31, delete "$\Box OPL_{cavity} = -480 \Box m$", insert -- $\Delta OPL_{cavity} = -480\ \mu m$ --.

Signed and Sealed this

Tenth Day of August, 2004

JON W. DUDAS
*Acting Director of the United States Patent and Trademark Office*

(12) United States Patent
Sochava et al.

(10) Patent No.: US 6,665,321 B1
(45) Date of Patent: Dec. 16, 2003

(54) TUNABLE LASER OPERATION WITH LOCALLY COMMENSURATE CONDITION

(75) Inventors: Sergei L. Sochava, Sunnyvale, CA (US); Andrew Daiber, Redwood City, CA (US); Mark McDonald, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,815

(22) Filed: Dec. 31, 2002

(51) Int. Cl.$^7$ ............................................. H01S 3/10
(52) U.S. Cl. ............................. 372/20; 372/23; 372/19; 372/98; 372/64; 372/92; 372/32; 372/29.023
(58) Field of Search .................... 372/20, 23, 19, 372/64, 98, 92, 29.023, 32

(56) References Cited

U.S. PATENT DOCUMENTS 6,526,071 B1 * 2/2003 Zorabedian et al. .......... 372/20

2002/0172239 A1 * 11/2002 McDonald et al. .......... 372/20

* cited by examiner

*Primary Examiner*—Leon Scott, Jr.
(74) *Attorney, Agent, or Firm*—Blakley, Sokoloff, Taylor & Zafman LLP

(57) ABSTRACT

A method for selecting free spectral ranges (FSR) of intra-cavity optics to optimize reliability of the channel switching mechanism and corresponding apparatus. In particular, the optimal relationship between the FSR of the internal etalon and the FSR of the laser cavity is derived. For the external cavity diode lasers (ECDL) the optimal relationship between the FSR of the internal etalon and the FSR of the gain chip is also derived. Equations are derived for selecting free spectral ranges of various optical cavities so as to create a locally commensurate condition under which the relative position of the lasing mode with respect to the transmission peak of the laser's tunable filter (e.g., etalon plus channel selector) does not change when the laser hops between adjacent channels.

29 Claims, 12 Drawing Sheets